US011605477B1

(12) United States Patent
Tsai et al.

(10) Patent No.: US 11,605,477 B1
(45) Date of Patent: Mar. 14, 2023

(54) EUV LITHOGRAPHY APPARATUS

(71) Applicant: TAIWAN SEMICONDUCTOR MANUFACTURING COMPANY, LTD., Hsinchu (TW)

(72) Inventors: Cheng Hung Tsai, Hsinchu (TW); Sheng-Kang Yu, Hsinchu (TW); Shang-Chieh Chien, New Taipei (TW); Heng-Hsin Liu, New Taipei (TW); Li-Jui Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/460,142

(22) Filed: Aug. 27, 2021

(51) Int. Cl.
  *G21K 1/06* (2006.01)
  *H05G 2/00* (2006.01)
  *G03F 7/20* (2006.01)
  *G02B 5/08* (2006.01)

(52) U.S. Cl.
  CPC .............. *G21K 1/06* (2013.01); *G02B 5/0891* (2013.01); *G03F 7/70033* (2013.01); *G03F 7/7055* (2013.01); *H05G 2/005* (2013.01); *H05G 2/008* (2013.01)

(58) Field of Classification Search
  CPC .... G21K 1/06; G02B 5/0891; G03F 7/70033; G03F 7/7055; H05G 2/005; H05G 2/008
  See application file for complete search history.

(56) References Cited

U.S. PATENT DOCUMENTS

| 8,796,666 | B1 | 8/2014 | Huang et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 9,618,837 | B2 | 4/2017 | Lu et al. |
| 9,869,928 | B2 | 1/2018 | Huang et al. |
| 9,869,934 | B2 | 1/2018 | Huang et al. |
| 9,869,939 | B2 | 1/2018 | Yu et al. |

*Primary Examiner* — Nicole M Ippolito
*Assistant Examiner* — Hanway Chang
(74) *Attorney, Agent, or Firm* — McDermott Will & Emery LLP

(57) ABSTRACT

An extreme ultra violet (EUV) light source apparatus includes a metal droplet generator, a collector mirror, an excitation laser inlet port for receiving an excitation laser, a first mirror configured to reflect the excitation laser that passes through a zone of excitation, and a second mirror configured to reflect the excitation laser reflected by the first mirror.

20 Claims, 15 Drawing Sheets

EUV LITHOGRAPHY APPARATUS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution lithography processes grows. One lithography technique is extreme ultraviolet lithography (EUVL). EUVL employs scanners using light in the extreme ultraviolet (EUV) region, having a wavelength of about 1-100 nm. Some EUV scanners provide 4×reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by an LPP collector and reflected by optics towards a lithography target, e.g., a wafer. The LPP collector is subjected to damage and degradation due to the impact of particles, ions, radiation, and most seriously, tin deposition.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

The present disclosure is generally related to an extreme ultraviolet (EUV) lithography system, apparatus and methods. More specifically, the present disclosure is directed to an apparatus to improve efficiency of an excitation laser usage and to locally heat a vessel and/or parts of a laser produced plasma EUV source apparatus.

Figure 1A:
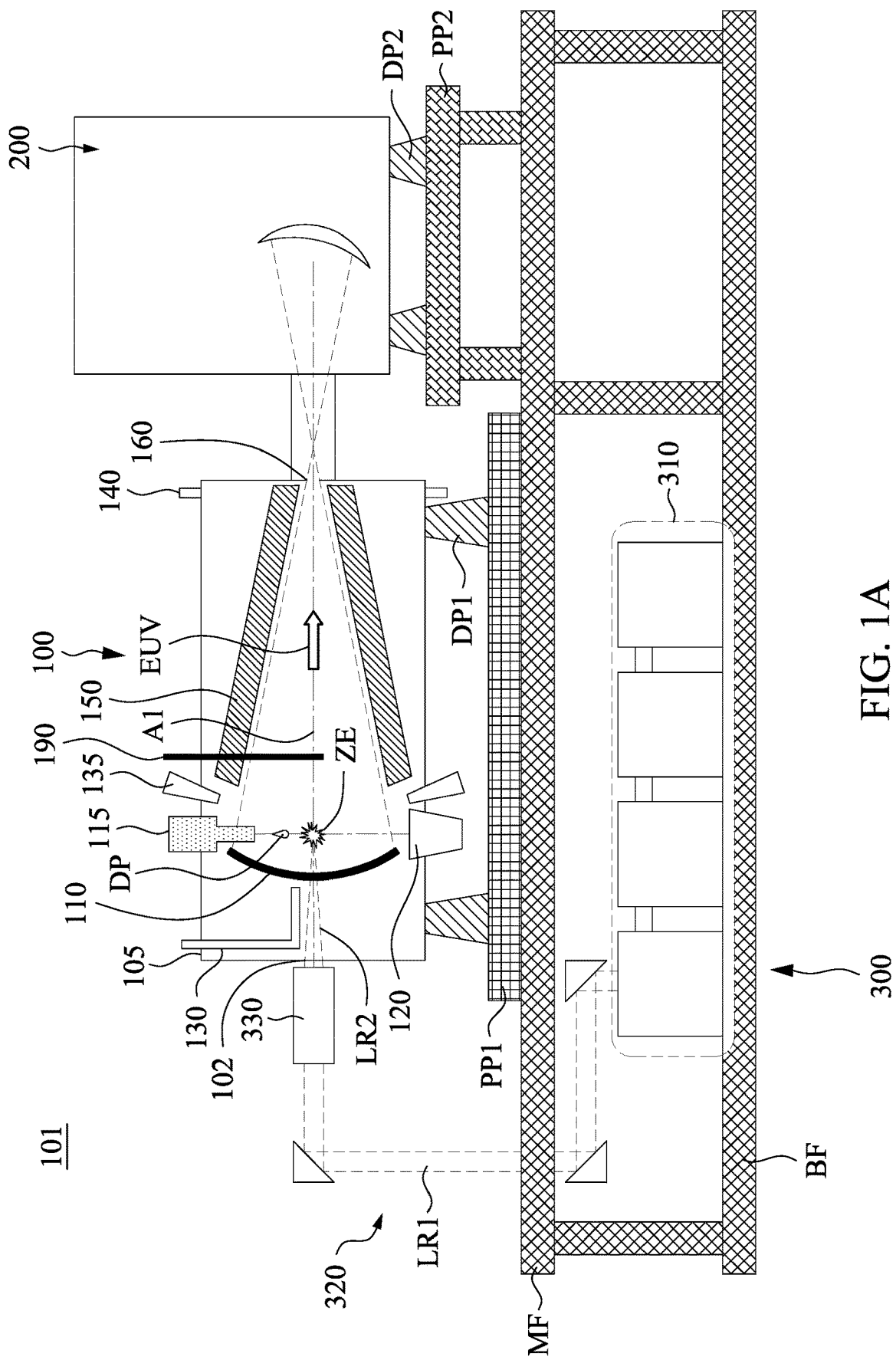
FIG. 1A is a schematic view of an extreme ultraviolet (EUV) lithography system with a laser produced plasma (LPP) EUV radiation source, constructed in accordance with some embodiments of the present disclosure.

FIG. 1A is a schematic and diagrammatic view of an EUV lithography system 101. The EUV lithography system 101 includes an EUV radiation source apparatus 100 to generate EUV light, an exposure tool 200, such as a scanner, and an excitation laser source apparatus 300. As shown in FIG. 1A, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a low pressure environment to avoid EUV intensity loss.

Figure 1B:
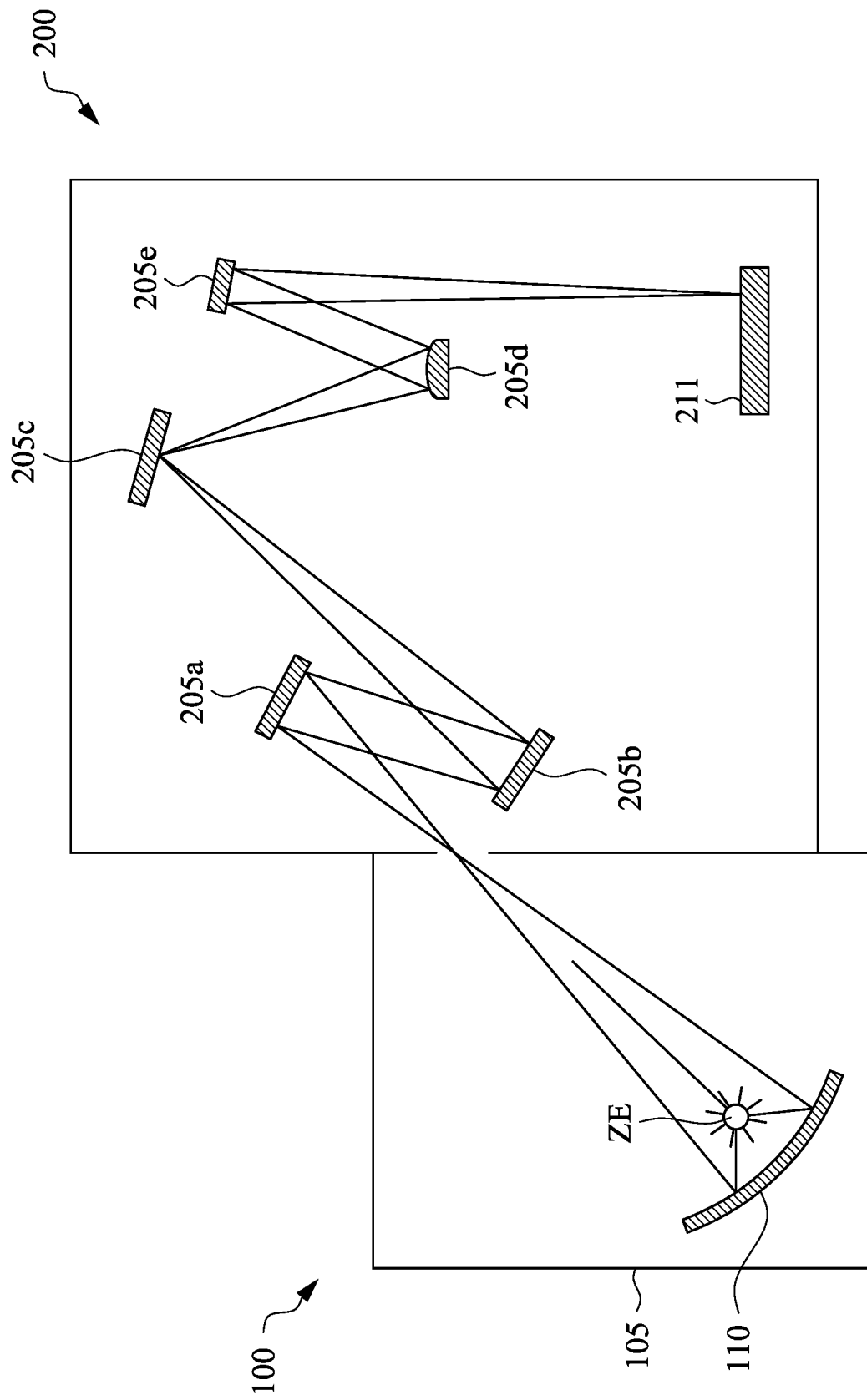
FIG. 1B is a schematic view of an EUV lithography system exposure tool according to embodiments of the disclosure.

FIG. 1B is a simplified schematic diagram of the exposure tool 200 according to an embodiment of the disclosure showing the exposure of photoresist coated substrate 211 with a patterned beam of EUV light. The exposure tool 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle 205c, with a beam of EUV light, to produce a patterned beam, and one or more reduction projection optics 205d, 205e, for projecting the patterned beam onto the substrate 211. The one or more optics 205a, 205b provide the beam of EUV light with a desired cross-sectional shape and a desired angular distribution. The reticle 205c is protected by a pellicle (not shown), which is held in place by a pellicle frame (not shown). The reticle 205c reflects and patterns the beam of EUV light.

Returning to FIG. 1B, following reflection from the reticle the patterned beam of EUV light is provided to the one or more optics 205d, 205e and is in turn projected onto the substrate 211 held by a mechanical assembly (e.g., substrate table (not shown)). In some embodiments, the one or more optics 205d, 205e apply a reduction factor to the radiation beam, forming an image with features that are smaller than corresponding features on the reticle. The mechanical assembly may be provided for generating a controlled relative movement between the substrate 211 and reticle 205c.

The EUV lithography system may, for example, be used in a scan mode, wherein the chuck and the mechanical assembly (e.g., substrate table) are scanned synchronously while a pattern imparted to the radiation beam is projected onto the substrate 211 (i.e. a dynamic exposure). The velocity and direction of the substrate table relative to the chuck is determined by the demagnification and image reversal characteristics of the exposure tool 200. The patterned beam of EUV radiation that is incident upon the substrate 211 comprises a band of radiation. The band of radiation is referred to, as an exposure slit. During a scanning exposure, the movement of the substrate table and the chuck is such that the exposure slit travels over an exposure field of the substrate 211. As further shown in FIG. 1B, the EUVL tool includes an EUV radiation source 100 including plasma at ZE (zone of excitation) emitting EUV light in a chamber 105 that is collected and reflected by a collector 110 along a path into the exposure tool 200 to irradiate the substrate 211. The zone of excitation (ZE) is a predetermined area where the metal (tin) droplet is irradiated by the excitation laser.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes TiO2 doped SiO2, or other suitable materials with low thermal expansion. The mask includes multiple reflective multiple layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules. As shown in FIG. 1A, the EUV radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μall). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation laser includes a pre-heat laser and a main laser. The pre-heat laser pulse is used to heat (or pre-heat) the target droplet to create a low-density target plume, which is subsequently heated (or reheated) by the main laser pulse, generating increased emission of EUV light. In various embodiments, the pre-heat laser pulses have a spot size about 100 µm or less, and the main laser pulses have a spot size about 200-300 µm.

The laser pulses LR2 are generated by the excitation laser source 300. The laser source 300 may include a laser generator 310, laser guide optics 320 and a focusing apparatus 330. In some embodiments, the laser generator 310 includes a carbon dioxide (CO2) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through an inlet port 102 including a window (or a lens) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector 110 has a reflective surface that reflects and focuses the EUV radiation for the lithography exposing processes. In some embodiments, a droplet catcher (or a tin bucket) 120 is installed opposite the target droplet generator 115. The droplet catcher 120 is used for catching excess target droplets. For example, some target droplets may be purposely missed by the laser pulses.

In some embodiments, the EUV radiation source 101 includes a laser scatterer or reflector 190 including one or more EUV optics to scatter or reflect the excitation laser LR2 after the excitation laser hits the target droplet and/or the misses the target droplet, thereby preventing the excitation laser LR2 from hitting EUV optics, such as the mirror 205a.

The collector 110 includes a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes multiple layers (such as a plurality of Mo/Si film pairs) and may further include a capping layer (such as Ru) coated on the multiple layers to substantially reflect the EUV light. In some embodiments, the collector 110 further includes a grating structure designed to effectively scatter the laser beam directed onto the collector 110. For example, a silicon nitride layer is coated on the collector 110 and is patterned to have a grating pattern in some embodiments.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris from exiting the chamber 105 and entering the exposure tool 200.

As shown in FIG. 1A, in some embodiments, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms or devices 150 are employed in the chamber 105. As shown in FIG. 1A, one or more debris collection mechanisms or devices 150 are disposed along optical axis A1 between the zone of excitation ZE and an output port 160 of the EUV radiation source 100.

Figure 1C:
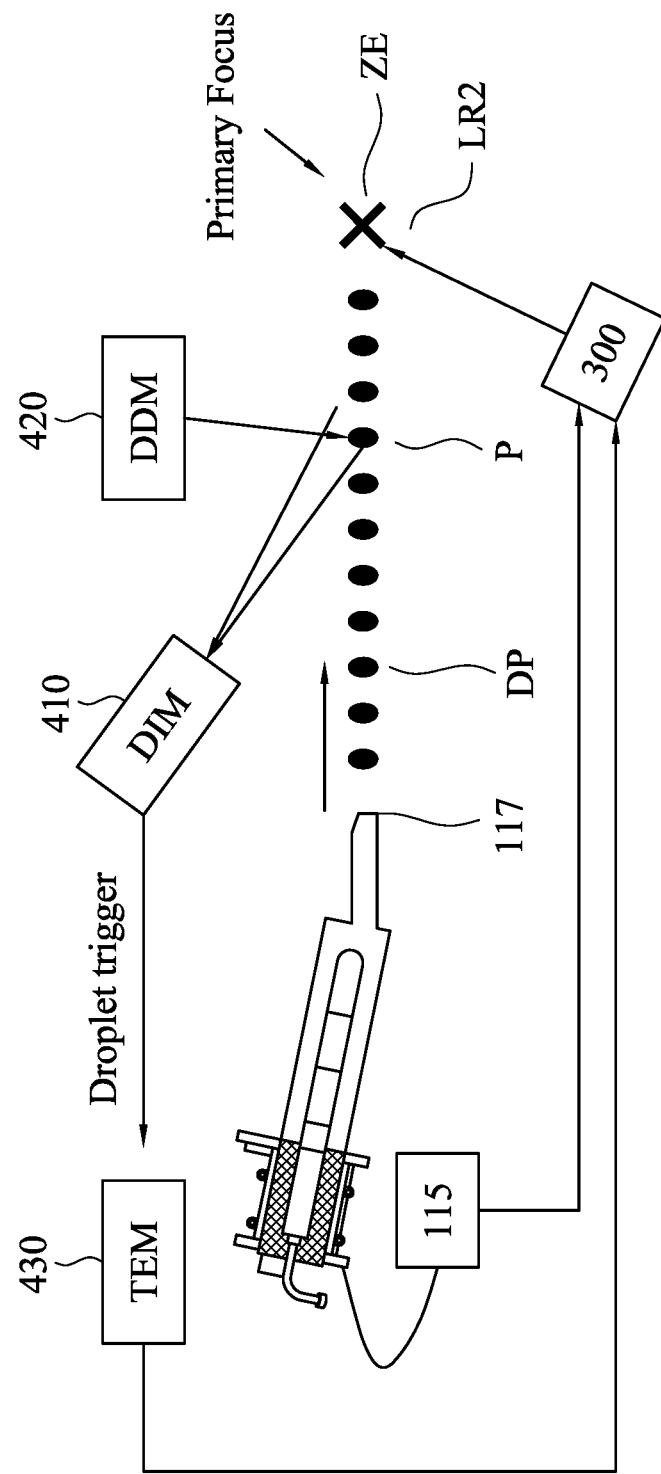
FIG. 1C schematically illustrates a device for synchronizing the generation of excitation pulses with the arrival of the target droplets in the zone of excitation in accordance with an embodiment of the present disclosure.

FIG. 1C schematically illustrates a device for synchronizing the generation of excitation pulses with the arrival of the target droplets in the zone of excitation used in the EUV lithography system illustrated in FIGS. 1A and 1B, in accordance with an embodiment. In an embodiment, a droplet illumination module (DIM) 410 is used for illuminating a target droplet DP ejected from the nozzle 117. The droplet illumination module 410 is focused at a fixed position P along the path of the target droplet DP from the nozzle 117 to the zone of excitation ZE. One of ordinary skill in the art will appreciate that once the excitation laser hits the target droplet DP within the zone of excitation ZE, the plasma formed because of ionization of the target droplet DP expands rapidly to a volume that is dependent on the size of the target droplet and the energy provided by the excitation laser. In various embodiments, the plasma expands several hundred microns from the zone of excitation ZE. As used herein, the term "expansion volume" refers to a volume to which plasma expands after the target droplets are heated with the excitation laser. Thus, the position P is fixed to be outside the expansion volume to avoid interference from the plasma. In an embodiment, the position P is fixed at a known distance, d, of several millimeters away from the zone of excitation ZE.

The droplet illumination module 410 is a continuous wave laser in an embodiment. In other embodiments, the droplet illumination module 410 is a pulsed laser. The wavelength of the droplet illumination module 410 is not particularly limited. In an embodiment, the droplet illumination module 410 has a wavelength in the visible region of electromagnetic spectrum. In some embodiments, the droplet illumination module 410 has a wavelength of about 1070 nm. In various embodiments, the droplet illumination module 410 has an average power in the range from about 1 W to about 50 W. For example, in an embodiment, the droplet illumination module 410 has an average power of about 1 W, about 5 W, about 10 W, about 25 W, about 40 W, about 50 W, or any average power between these values. In some embodiments, the droplet illumination module 410 generates a beam having a uniform illumination profile. For example, in an embodiment, the droplet illumination module 410 creates a fan-shaped light curtain having substantially the same intensity across its profile. The beam produced by the droplet illumination module 410 has a width in the range of about 10 μm to about 300 μm in various embodiments.

As the target droplet DP passes through the beam generated by the droplet illumination module 410, the target droplet DP reflects and/or scatters the photons in the beam. In an embodiment, the target droplet DP produces a substantially Gaussian intensity profile of scattered photons. The photons scattered by the target droplet DP are detected by a droplet detection module (DDM) 420 (interchangeably referred to herein as "droplet detector 420"). The center of the target droplet DP corresponds to the peak of the intensity profile detected at the droplet detection module 420. In some embodiments, the droplet detection module 420 is a photodiode and generates an electrical signal upon detecting the photons reflected and/or scattered by the target droplet DP. Thus, the droplet detection module 420 detects when a target droplet has passed position P.

The time, $t_0$, at which the droplet detection module 420 detects the target droplet DP passing the position P is provided to a timing and energy measurement module 430. Once the target droplet reaches the zone of excitation ZE and is heated with an excitation laser pulse LR2, the material of the target droplet is ionized into plasma, which emits EUV radiation EUV. This EUV radiation is detected by the timing and energy measurement module (TEM) 430.

In an embodiment, the timing and energy measurement module 430 includes a detector configured to detect the EUV power generated at each instance of plasma generation. The detector includes a photodiode or a filtered photodiode configured to convert the energy from photons incident on it into an electrical signal in some embodiments. In an embodiment, the detector also includes a mirror that reflects the EUV radiation from a fixed position in the exposure tool on to the photodiode.

The timing and energy measurement module 430, in an embodiment, is configured to estimate the time at which the power of the EUV radiation peaks, $t_{rad}$. The speed of the target droplet is then used to trigger the excitation pulse for a subsequent target droplet. Those of skill in the art would appreciate that in order to estimate the time at which EUV power peaks, it is not necessary to measure the absolute power EUV power generated at every instance of plasma generation, rather the rate of change of EUV power is sufficient to estimate the precise time at which the EUV power peaks.

Speed of a target droplet is calculated based on a peak in the EUV energy, and this measurement of speed is used to trigger an excitation pulse for the next target droplet. In an embodiment, the timing and energy measurement module 430 is further configured to calculate the precise time at which the next target droplet will arrive at the zone of excitation ZE, and provide a trigger signal to the excitation laser source 300 to control the trigger time for the excitation pulse LR2.

In the LPP EUV radiation source apparatus as set forth above, some of the laser pulses of the excitation laser LR2 do not hit the target droplet and merely pass through the zone of excitation ZE. In some embodiments, the missed excitation laser LR2 is scattered by scattering optics 190, and the scattered excitation laser heats vanes of the debris collection mechanisms 150 to melt tin debris deposited on the vanes.

Productivity of wafer manufacturing in a semiconductor manufacturing operation relates to the input EUV energy on wafer (EUV dosage) and the conversion efficiency of the laser-plasma interaction between the excitation laser and the tin droplets. An increase of the EUV energy is achievable by raising the excitation laser power, which may increase electrical power usage. In the present disclosure, the excitation laser, which hits and/or misses the tin droplets, is reused, and is directed to the zone of excitation to hit the tin droplet again. The excitation laser is collected by one or more mirrors after passing through the zone of excitation inside the vessel and refocused on the droplet/plasma to enhance the conversion efficiency and reduce the debris production.

Figure 2:
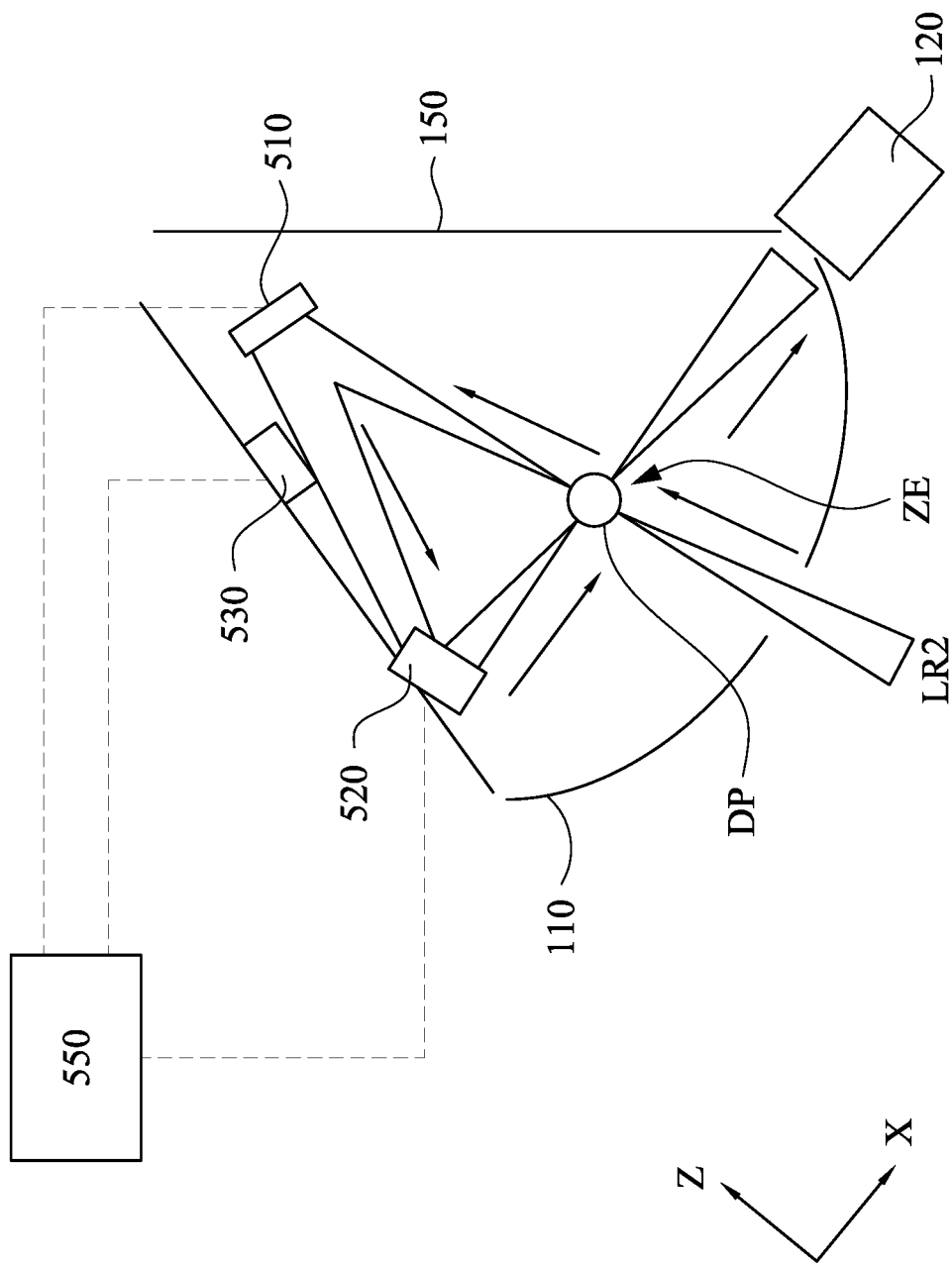
FIG. 2 shows a schematic configuration of an LPP EUV radiation source according to an embodiment of the present disclosure.

FIG. 2 shows a schematic configuration of an LPP EUV radiation source according to an embodiment of the present disclosure. Materials, configuration, parts, components, structures, and/or operations explained with respect to FIGS. 1A-1C are also employed in the following embodiments and the detailed explanation may be omitted.

As shown in FIG. 2, one or more mirrors that reflect the excitation laser LR2 are disposed inside the vacuum vessel of the LPP EUV radiation source. In some embodiments, a first mirror 510 and a second mirror 520 are disposed. The first mirror is located between the zone of excitation ZE and the output port 160 of the EUV radiation source along the Z direction, which is the initial direction of the excitation laser LR2. The first mirror located in the Z direction can prevent the excitation laser from emitting from the output port and prevent the optical components of the EUV scanner from being damaged. The second mirror 520 is located along the —X direction from the first mirror 510 (12 o'clock position), where the +X direction is the travel direction of the tin droplet from the droplet generator 115. The first mirror 510 and the second mirror 520 have a reflection surface made of a Cu or a Cu alloy layer formed on a mirror body. In other embodiments, the mirrors are made of Cu or a Cu alloy. In some embodiments, the diameter of the first and second mirrors is about 1 cm to about 15 cm in some embodiments.

In some embodiments, at least one of the first mirror 510 and the second mirror 520 is a concave mirror that reflects and focuses the excitation laser LR2 passing through the zone of excitation ZE. In some embodiments, at least one of the first mirror 510 and the second mirror 520 is a flat mirror that merely reflects the excitation laser LR2.

In some embodiments, the excitation laser LR2 passing through the zone of excitation ZE is reflected by the first mirror 510 and is directed to the second mirror 520. As set forth above, in some embodiments, the reflected laser by the first mirror 510 focuses on the second mirror 520. Then, the reflected excitation laser is further reflected by the second mirror 520 and is directed to the zone of excitation ZE. In some embodiments, the reflected laser by the second mirror 520 focuses at the zone of excitation.

In some embodiments, the excitation laser reflected by the second mirror 520 is further directed to a part of the vessel or a component of the EUV radiation source apparatus. In some embodiments, the excitation laser reflected by the second mirror 520 is further directed to the droplet catcher 120 to heat the droplet catcher 120. In some embodiments, at least the entrance port of the droplet catcher 120 is irradiated with the excitation laser.

In some embodiments, a controller 550 is coupled to the first and/or second mirrors to control the positions, angles and any other parameters of the mirrors. In some embodiments, the first and/or second mirrors are configured to be movable by an adjusting mechanism, which includes one or more of an actuator (e.g. piezo actuator), a motor, a piston, a gear, or any other mechanical or electrical parts. Further, in some embodiments, one or more sensors 530 are installed inside the vessel to monitor the excitation laser and/or the vessel interior. In some embodiments, the sensor 530 includes a camera or a thickness measurement device.

Figure 3:
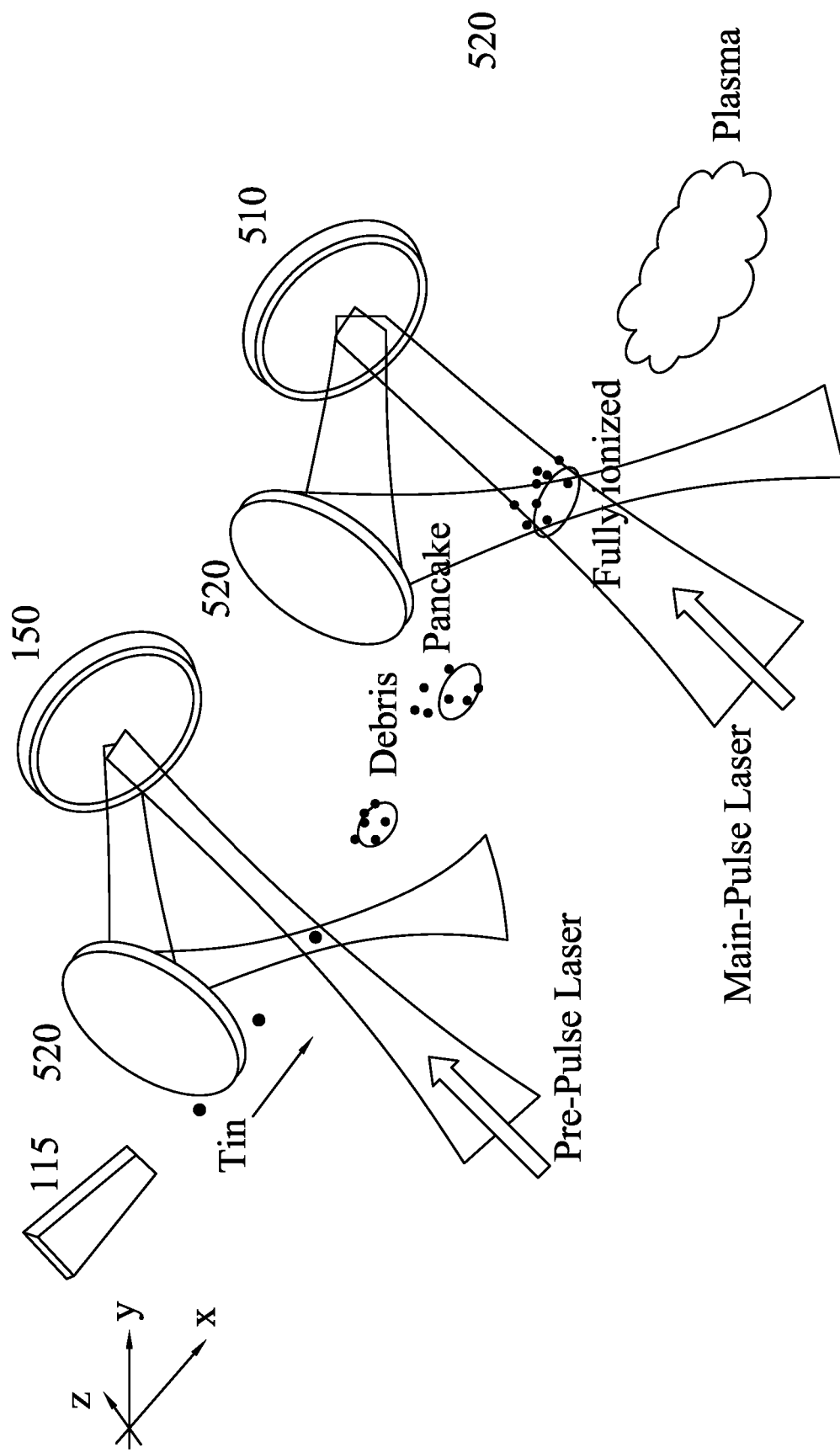
FIG. 3 shows a diagram explaining a reuse of excitation laser according to an embodiment of the present disclosure

FIG. 3 shows a diagram explaining a reuse of excitation laser LR2 according to an embodiment of the present disclosure. As set forth above, the excitation laser includes a pre-pulse laser and a main pulse laser.

In case of the pre-pulse laser irradiation, the excitation laser initially directed to the zone of excitation ZE hits a tin droplet, which causes the tin droplet to expand into a pancake shape. Since the size of the excitation laser is greater than the size of the tin droplet, most or some of the excitation laser passes through the zone of excitation and is directed to the first mirror 510. The excitation laser is then reflected by the first and second mirrors, and is directed back to the zone of excitation to irradiate the tin droplet again, as shown in FIG. 3. In some embodiments, the same tin droplet is irradiated by the same laser pulse, i.e., the initial laser pulse and the reflected laser pulse.

Similarly, in case of the main-pulse laser irradiation, the excitation laser initially directed to the zone of excitation ZE hits the pancake-shaped tin droplet, which makes the tin droplet into plasma. The excitation laser is then reflected by the first and second mirrors, and is directed back to the zone of excitation to irradiate the tin droplet again, as shown in FIG. 3. In some embodiments, the same tin droplet is irradiated by the same laser pulse, i.e., the initial laser pulse and the reflected laser pulse.

In some embodiments, the focal point of the reflected excitation laser is slightly different from the focal point of the initial excitation laser to account for a time delay caused by the excitation laser traveling from the zone of excitation and back to the zone of excitation via the first and second mirrors. The difference is about 10 nm to 10 μm along the +X direction in some embodiments. In some embodiments, the time delay is measured by the droplet illumination module (DIM) 410 and/or the droplet detection module (DDM) 420 shown in FIG. 1C, and at least one of the first and second mirrors is adjusted by the controller 550 so as to adjust the focal point of the reflected excitation laser.

FIGS. 4A-4E show configurations of mirrors in accordance with various embodiments of the present disclosure. Materials, configurations, parts, components, structures, and/or operations explained with respect to FIGS. 1A-3 are also employed in the following embodiments and the detailed explanation may be omitted.

Figure 4A:
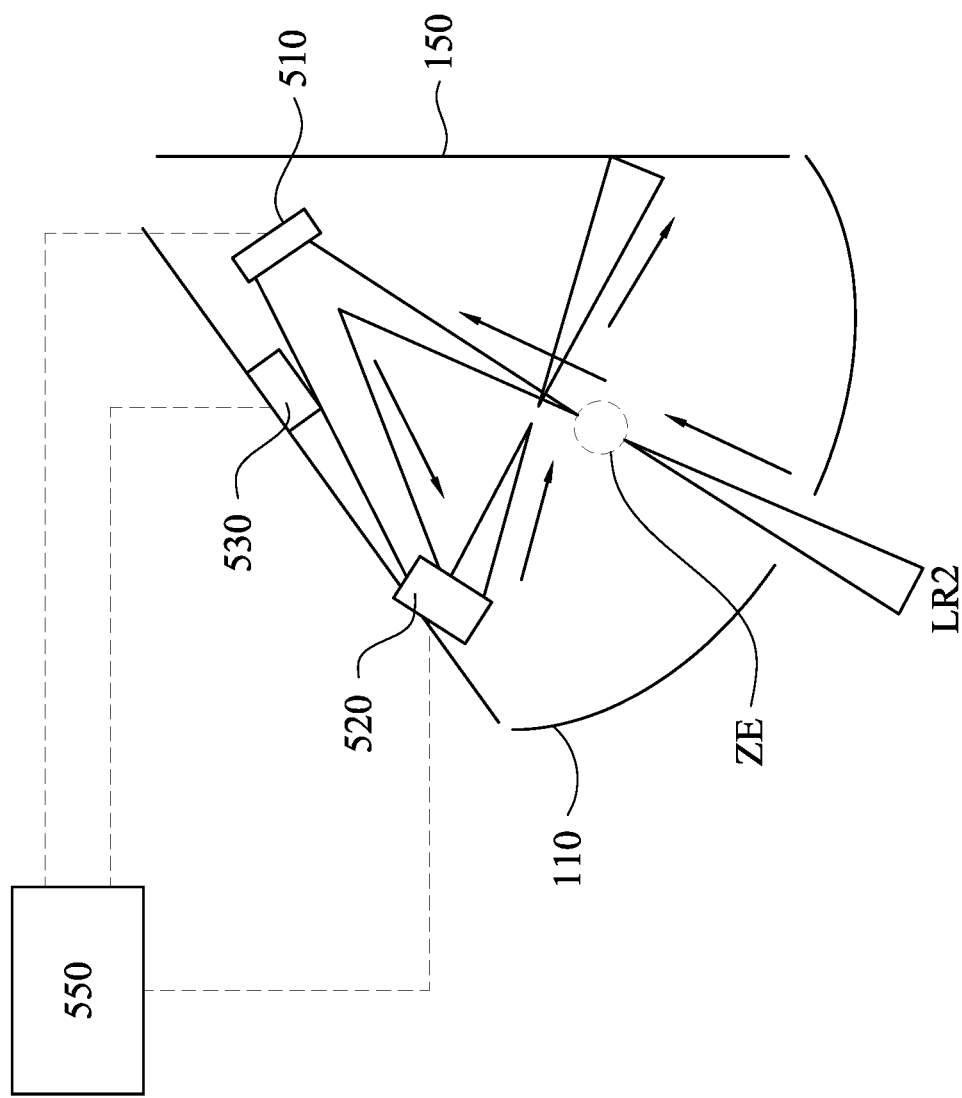
FIGS. 4A, 4B, 4C, 4D and 4E show configurations of mirrors in accordance with various embodiments of the present disclosure.
Figure 4B:
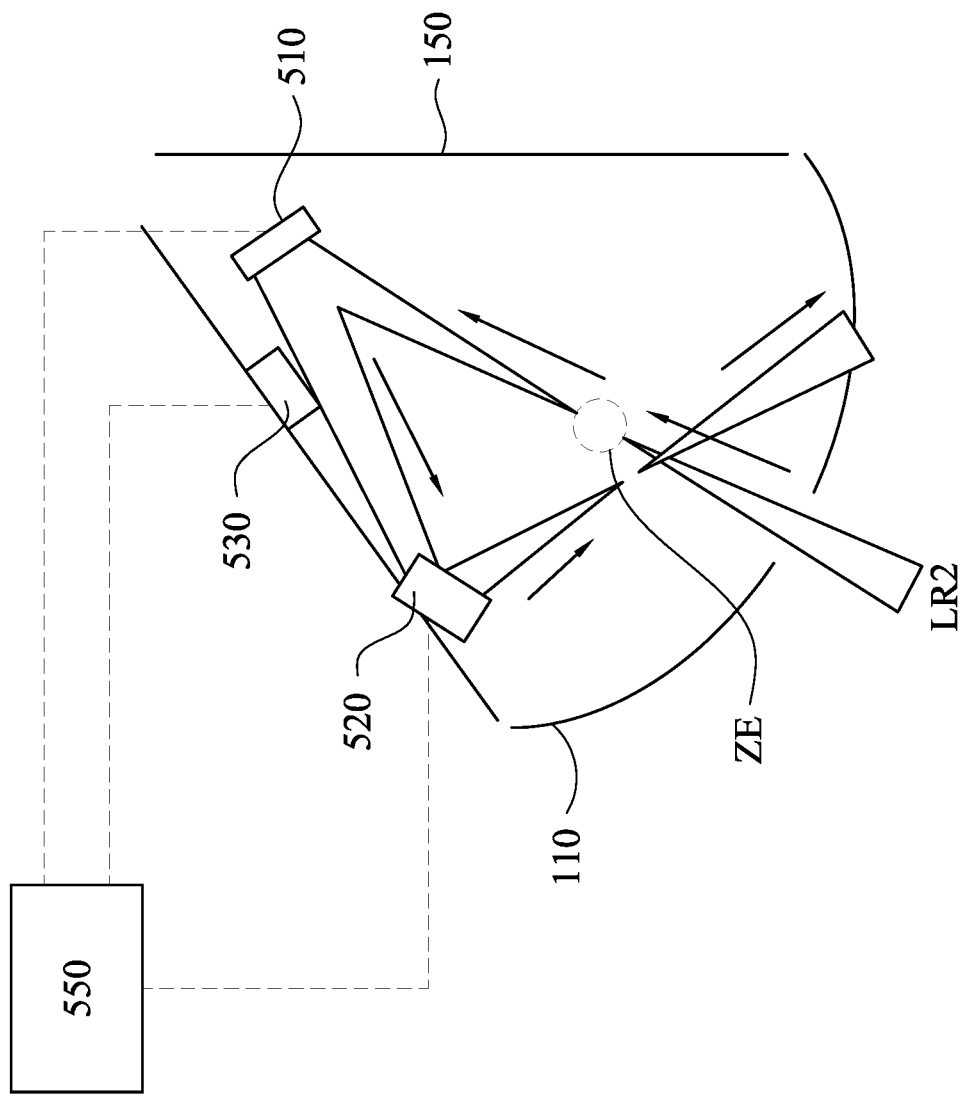

In some embodiments, the reflected excitation laser from the second mirror 520 does not pass through the zone of excitation again, but is directed to a part or a component inside the vessel, to locally heat the part or the component, as shown in FIGS. 4A and 4B. In some embodiments, the reflected excitation laser is directed to the vane 150 of the debris collection mechanism to melt deposited tin debris thereon, as shown in FIG. 4A. In other embodiments, the reflected excitation laser is directed to the collector mirror 110 to melt deposited tin debris thereon, as shown in FIG. 4B. In some embodiments, the controller controls the excitation light source 300 to adjust (e.g., reduce) output laser power to minimize damage on the collector mirror.

Figure 4C:
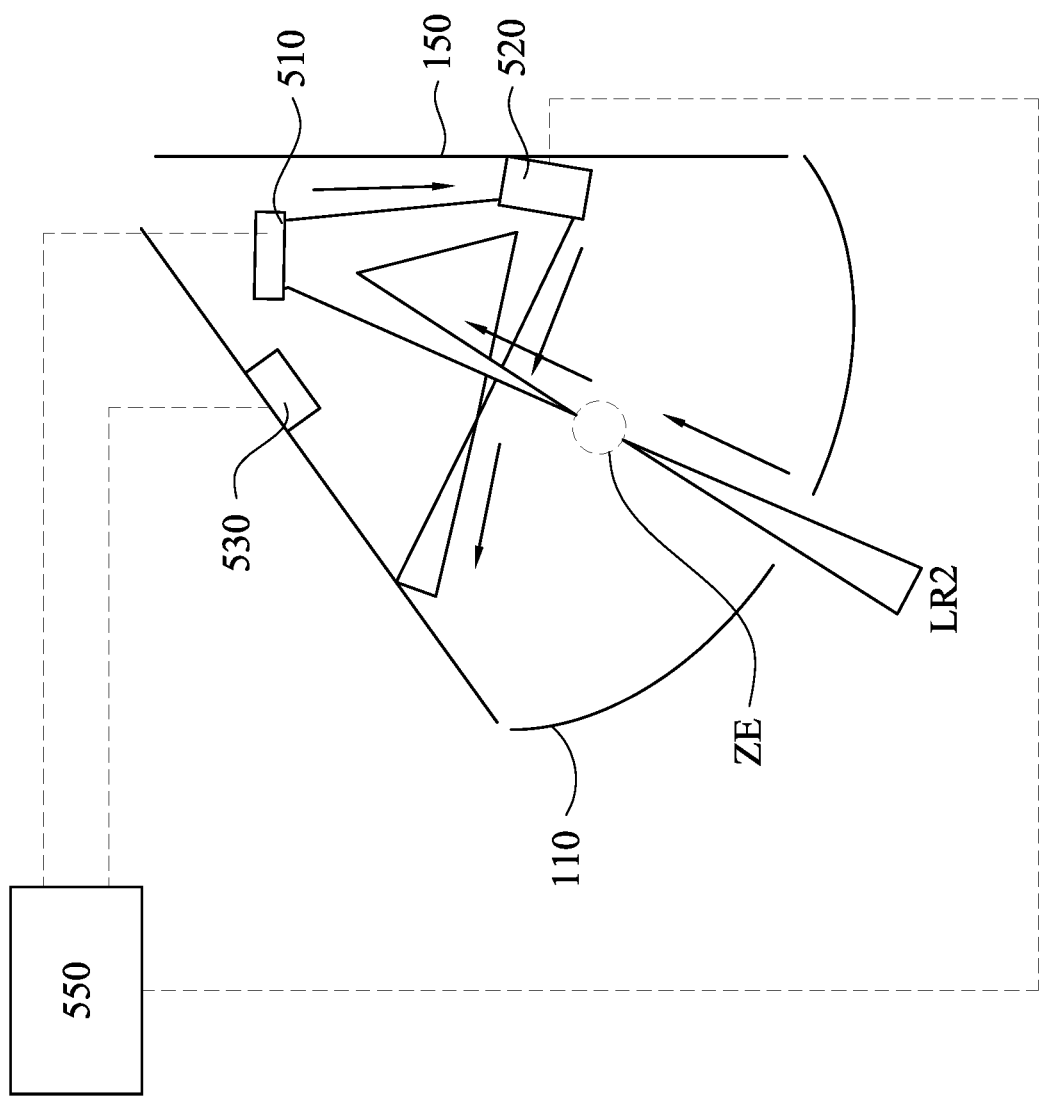
Figure 4D:
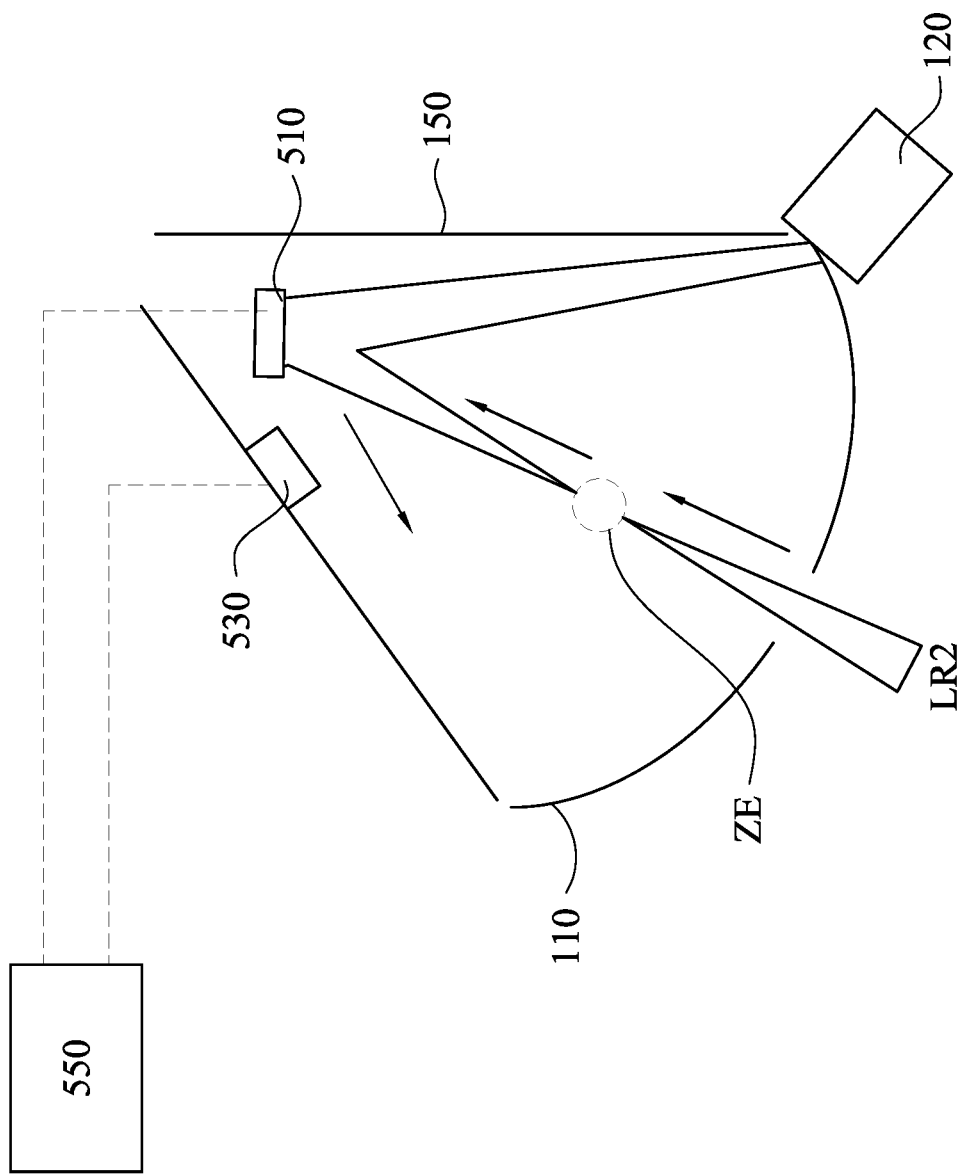

In FIG. 4C, in some embodiments, the second mirror 520 is located at other than the 12 o'clock position, for example, the 6 o'clock position so that the reflected excitation laser is directed to —X direction. In FIG. 4D, in some embodiments, no second mirror is used and the first mirror is controlled to direct the reflected excitation laser to a desired location inside the vessel.

Figure 4E:
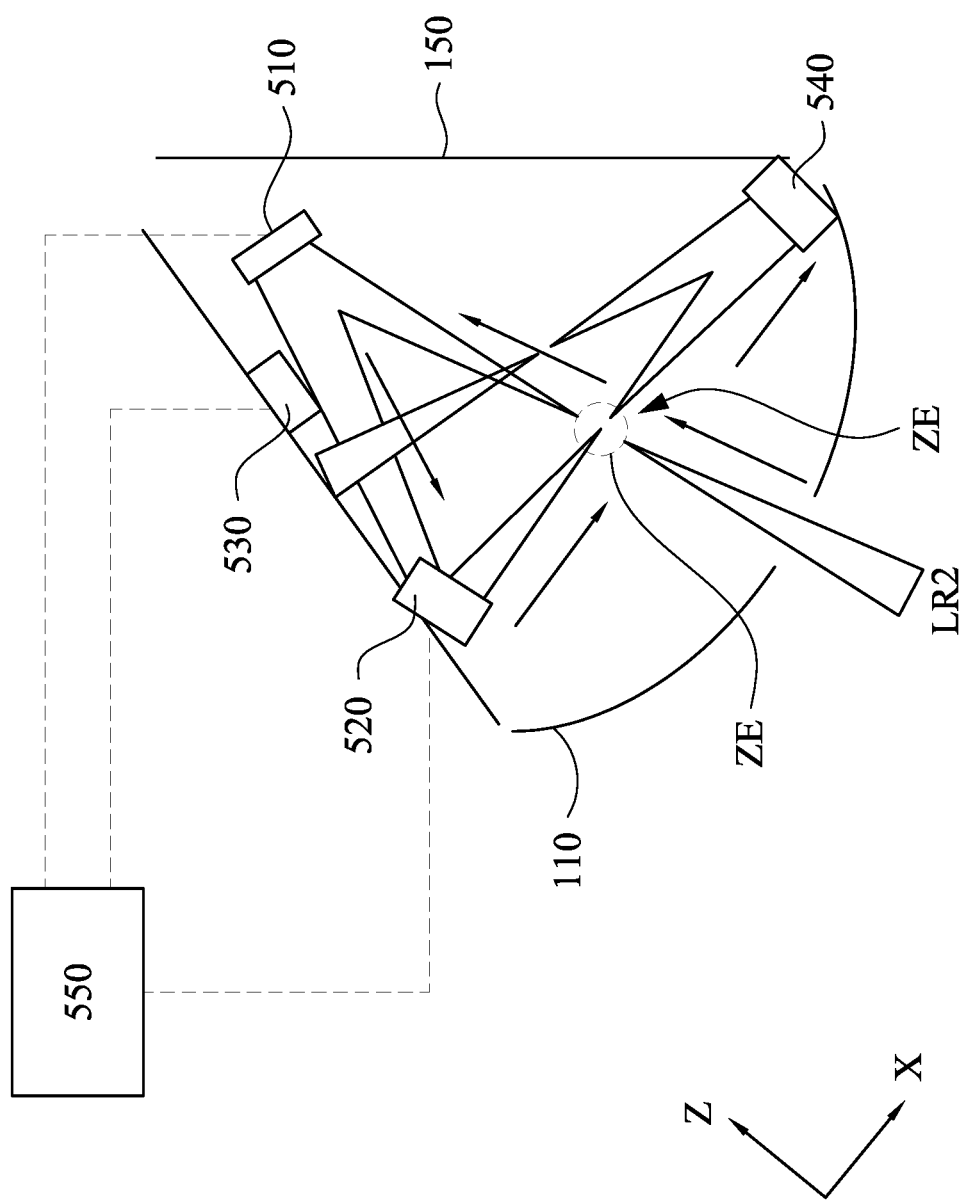

Further, in some embodiments, as shown in FIG. 4E, a third mirror 540 is located at the 6 o'clock position or nearby, to direct the reflected excitation laser that passes the zone of excitation twice to a desired location.

In some embodiments, the sensor 530 is configured to detect deposition of the tin debris inside the vessel. As set forth above, the sensor 530 includes a camera in some embodiments, the camera monitors the deposition of the tin debris. In some embodiments, the camera is movable to scan the inside the vessel. When the deposition of the tin debris is excessive (e.g., greater than a threshold amount in terms of e.g., area or thickness), the controller 550 controls one or more of the first and second mirrors to direct the reflected excitation laser toward the area where the excessive tin debris is deposited.

In some embodiments, the heating and melting operation by the reflected excitation laser is performed without generating the tin droplets, as a part of cleaning and/or maintenance operation of the EUV radiation source. In some embodiments, at least one of the first mirror 510 or the second mirror 520 is controlled to scan the reflected radiation laser inside the vessel so that various locations inside the vessel is heated.

Figure 5:
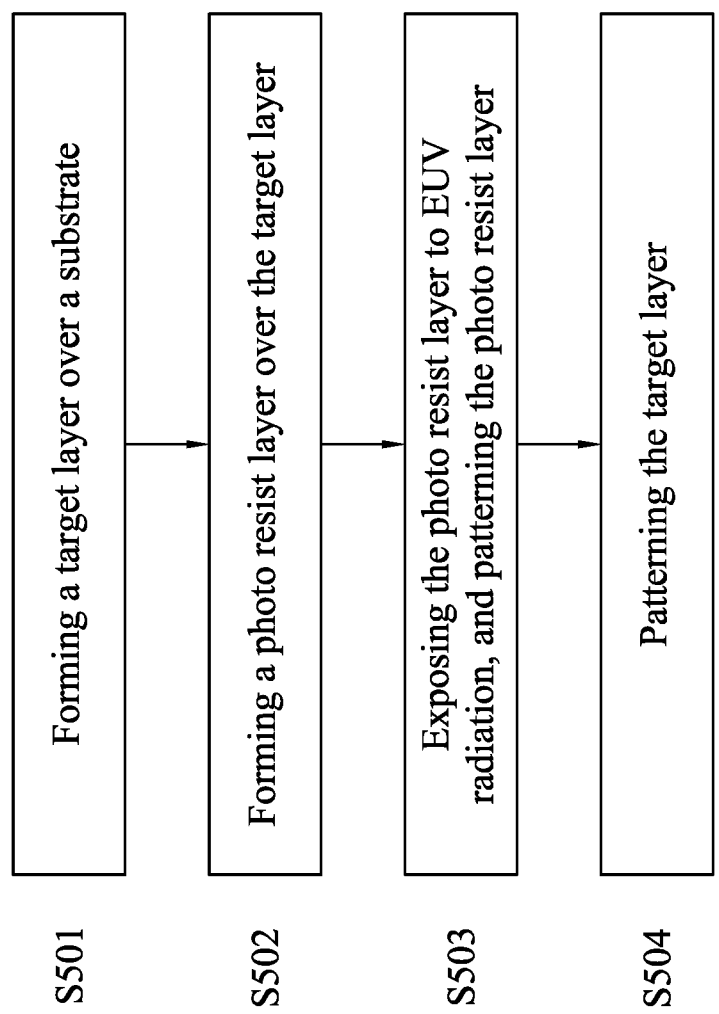
FIG. 5 shows a flowchart of a method of making a semiconductor device.
Figure 6A:
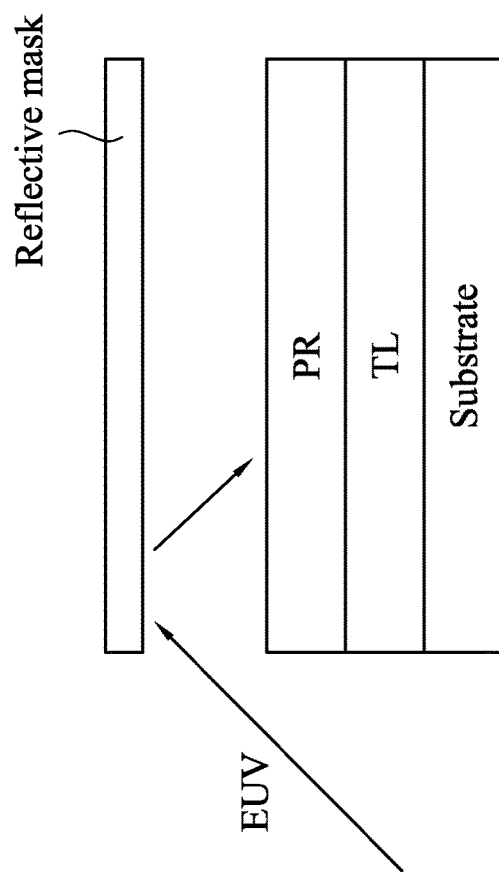
FIGS. 6A, 6B, 6C and 6D show a sequential manufacturing operation of the method of making a semiconductor device in accordance with embodiments of present disclosure.
Figure 6B:

FIG. 5 shows a flowchart of a method of making a semiconductor device, and FIGS. 6A, 6B, 6C and 6D show a sequential manufacturing operation of the method of making a semiconductor device in accordance with embodiments of the present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S501 of FIG. 5, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S502, of FIG. 5, a photo resist layer is formed over the target layer, as shown in FIG. 6A. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable techniques. The coated photo resist layer may be further baked to drive out solvent in the photo resist layer. At S503 of FIG. 5, the photoresist layer is patterned using an EUV reflective mask, as shown in FIG. 6B. The patterning of the photoresist layer includes performing a photolithography exposing process by an EUV exposing system including the LPP EUV radiation source of the present disclosure, using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

Figure 6C:
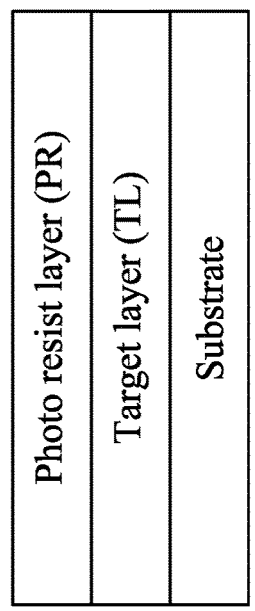
Figure 6D:
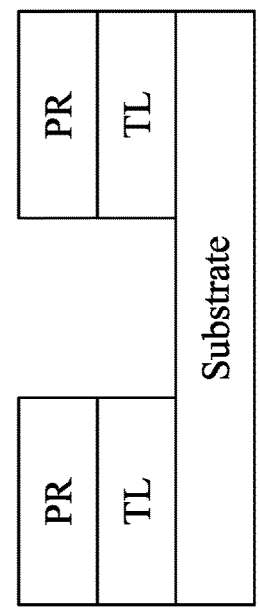

At S504 of FIG. 5, the target layer is patterned utilizing the patterned photoresist layer as an etching mask, as shown in FIG. 6C. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 6D.

Figure 7:
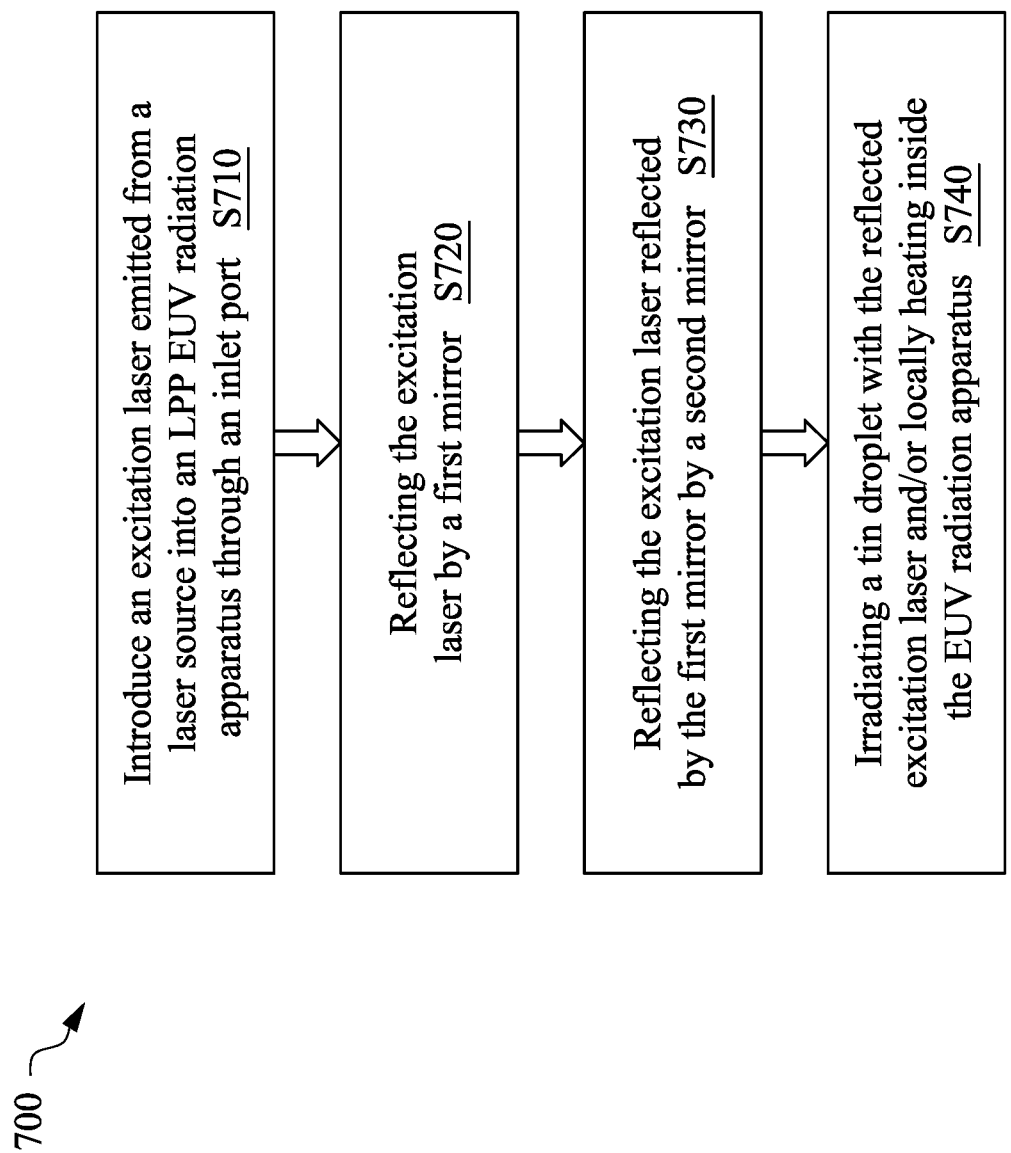
FIG. 7 illustrates a flow diagram of a process for operating an LPP EUV radiation source apparatus in accordance with some embodiments of the disclosure.

FIG. 7 illustrates a flow diagram of an exemplary process 700 for operating an LPP EUV radiation source apparatus in accordance with some embodiments of the disclosure. The process 700 or a portion of the process 700 may be performed by the LPP EUV radiation apparatus as described in this disclosure. In some embodiments, the process 700 or a portion of the process 700 is performed and/or is controlled by the computer system 900, which includes or is a part of the controller 550, described below with respect to FIGS. 9A and 9B. In some embodiments, the process 700 or a portion of the process 700 is performed by the control system 800, which includes or is a part of the controller 550, of FIG. 8 described below. The method includes an operation S710, where an excitation laser emitted from a laser light source is introduced into the EUV light source.

In operation S720, the excitation laser is reflected by a first mirror. In some embodiments, the excitation laser hits a tin droplet before it is reflected by the first mirror. In other embodiments, no tin droplet is generated and thus the excitation laser merely passes through the zone of excitation.

In operation S730, the excitation laser reflected by the first mirror is further reflected by a second mirror. In operation S740, the excitation laser reflected by the second mirror is directed to the zone of excitation to irradiate the tin droplet, and/or to locally heat a part, a component or a location inside the EUV radiation source apparatus.

Figure 8:
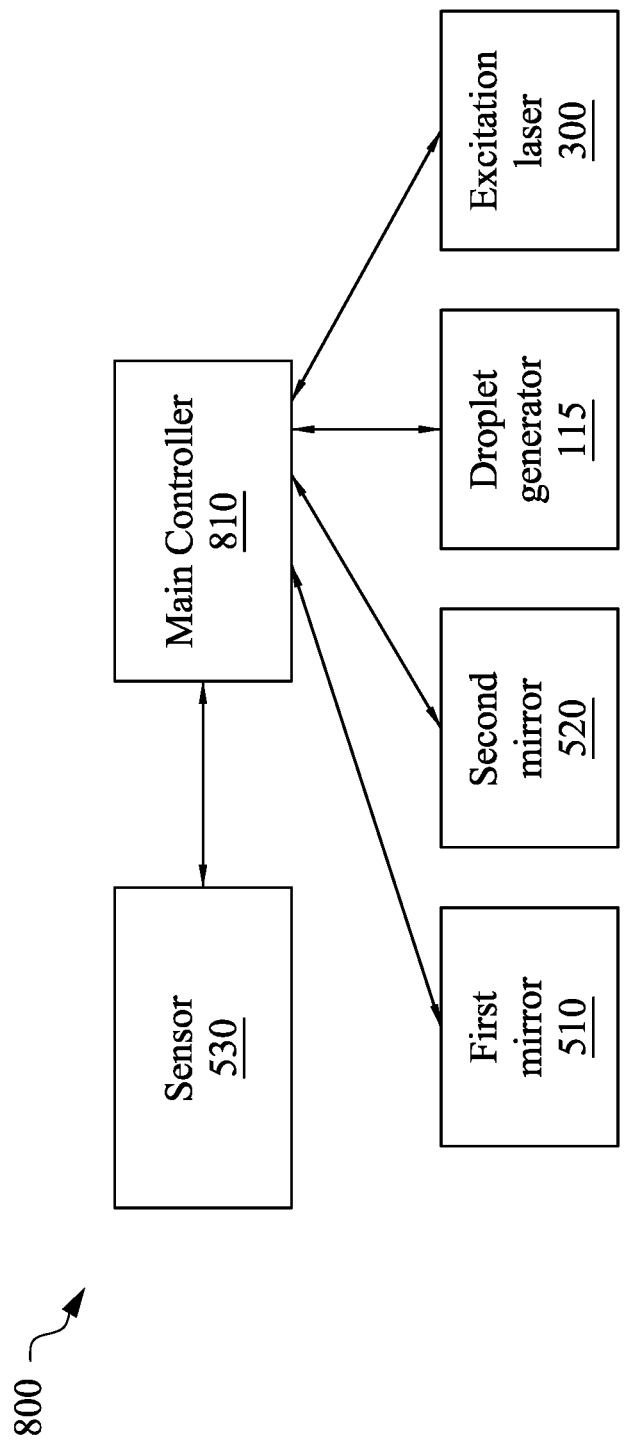
FIG. 8 shows a control system for operating an LPP EUV radiation source apparatus in accordance with some embodiments of the present disclosure.

FIG. 8 shows a control system 800 for operating an LPP EUV radiation source apparatus in accordance with some embodiments of the present disclosure. The control system 800 includes a main controller 810, which includes or is a part of the controller 550, one or more sensors 530, a first mirror 510 and a second mirror 520 coupled to the main controller 810. The main controller 810 is further coupled to the droplet generator 115 and/or the excitation laser source 300 in some embodiments.

In some embodiments, the controller is configured to control the second mirror to adjust the reflection of the excitation laser based on a monitoring result of the sensor. In some embodiments, when the sensor detects an excessive debris deposition above a threshold, the controller is configured to control the second mirror to direct the excitation laser reflected by the second mirror to the excessive debris deposition. In some embodiments, the controller is configured to control the first mirror to adjust the reflection of the excitation laser. In some embodiments, the controller is configured to control the second mirror to locally heat inside the EUV light source apparatus. In some embodiments, the controller stops the operation of the droplet generator, and controls the first and/or second mirror to locally heat the inside of the vessel with the reflected excitation laser. In some embodiments, the controller controls the excitation light source 300 to adjust the output laser power.

Figure 9A:
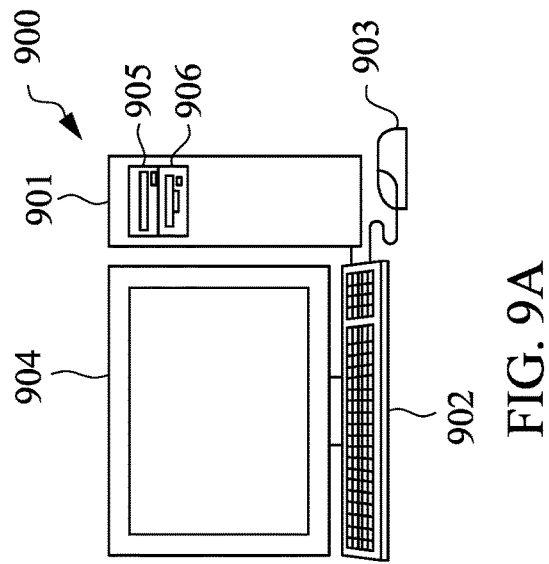
FIGS. 9A and 9B illustrate an apparatus for operating an LPP EUV radiation source apparatus in accordance with some embodiments of the present disclosure.
Figure 9B:
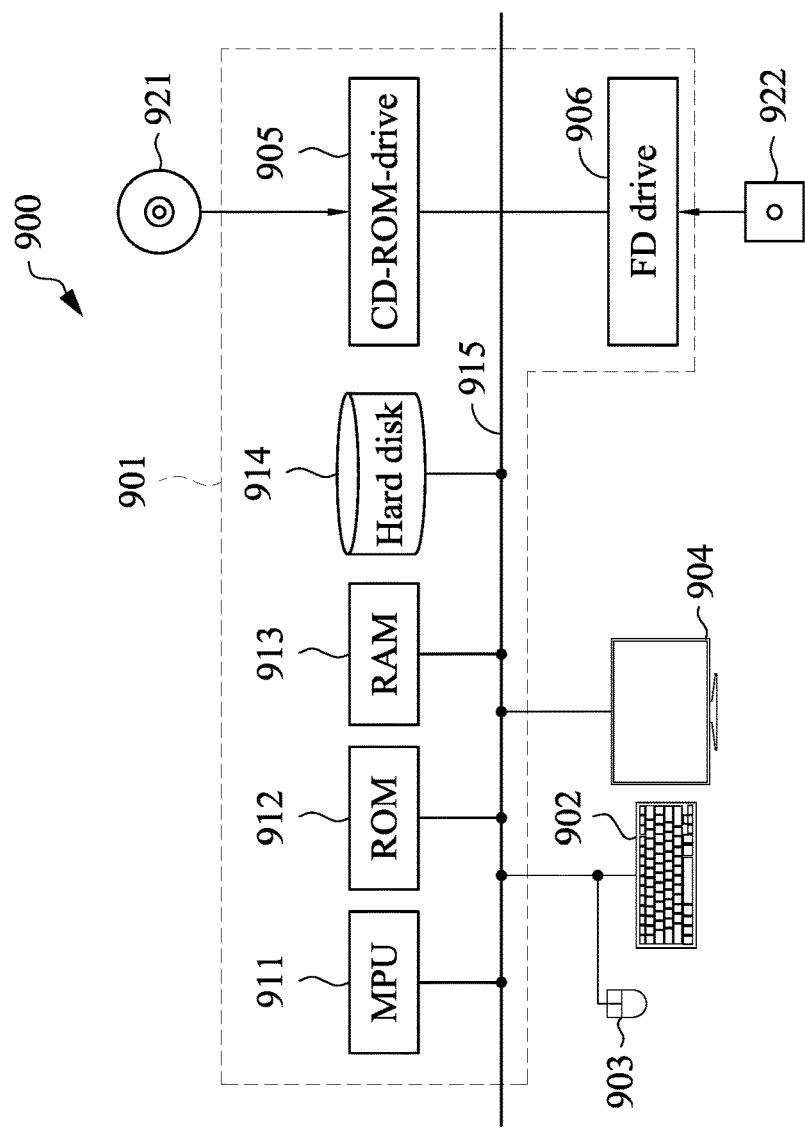

FIGS. 9A and 9B illustrate an apparatus for operating an LPP EUV radiation source apparatus in accordance with some embodiments of the present disclosure. In some embodiments, the computer system 900 is used for performing the functions of the modules of FIG. 8. In some embodiments, the computer system 900 is used to execute the process 700 of FIG. 7.

FIG. 9A is a schematic view of a computer system that performs the functions of operating an LPP EUV radiation source apparatus. All of or a part of the processes, method and/or operations of the foregoing embodiments can be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors, such as a micro processing unit (MPU) 911, a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. The computer 901 may include a network card (not shown) for providing a connection to a LAN.

The program for causing the computer system 900 to execute the functions for operating an LPP EUV radiation source apparatus in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network. The program does not necessarily have to include, for example, an operating system (OS) or a third party program to cause the computer 901 to execute the functions of the control system for operating an LPP EUV radiation source apparatus in the foregoing embodiments. The program may only include a command portion to call an appropriate function (module) in a controlled mode and obtain desired results.

Embodiments of the present disclosure are directed to improving efficiency of the usage of an excitation laser in an LPP EUV light source apparatus. By reflecting the excitation laser after hitting a metal droplet or passing through a zone of excitation, and reusing the excitation laser to generate metal plasma and/or to locally heat the inside the LPP EUV light source apparatus, it is possible improve operation efficiency of the excitation laser source and to reduce deposition of metal debris inside the LPP EUV light source apparatus.

It will be understood that not all advantages have been necessarily discussed herein, no particular advantage is required for all embodiments or examples, and other embodiments or examples may offer different advantages.

According to some embodiments of the present disclosure, an extreme ultra violet (EUV) light source apparatus includes a metal droplet generator, a collector mirror, an excitation laser inlet port for receiving an excitation laser, a first mirror configured to reflect the excitation laser that passes a zone of excitation, and a second mirror configured to reflect the excitation laser reflected by the first mirror. In one or more of the foregoing or following embodiments, the second mirror is configured such that the excitation laser reflected by the second mirror passes the zone of excitation. In one or more of the foregoing or following embodiments, the EUV light source apparatus further includes a metal droplet catcher. The second mirror is configured such that the metal droplet catcher is irradiated with the excitation laser reflected by the second mirror. In one or more of the foregoing or following embodiments, the first mirror and the second mirror are configured such that the excitation laser reflected by the second mirror hits a metal droplet that is hit by the excitation laser before reflected by the first mirror. In one or more of the foregoing or following embodiments, the second mirror is configured such that the excitation laser reflected by the second mirror does not pass the zone of excitation. In one or more of the foregoing or following embodiments, the EUV light source apparatus further includes a debris collection mechanism, and the second mirror is configured such that the excitation laser reflected by the second mirror is directed to a part of the debris collection mechanism. In one or more of the foregoing or following embodiments, the second mirror is configured such that the excitation laser reflected by the second mirror is directed to the collector mirror. In one or more of the foregoing or following embodiments, at least one of the first mirror or the second mirror is a convex mirror. In one or more of the foregoing or following embodiments, at least one of the first mirror or the second mirror is a flat mirror. In one or more of the foregoing or following embodiments, the first mirror and the second mirror have a reflection surface made of Cu or a Cu alloy.

According to some embodiments of the present disclosure, an EUV light source apparatus includes a metal droplet generator, a collector mirror, an excitation laser inlet port for receiving an excitation laser, a first mirror configured to reflect the excitation laser that passes a zone of excitation, a second mirror configured to reflect the excitation laser reflected by the first mirror, and a controller configured to control the second mirror to adjust reflection of the excitation laser. In one or more of the foregoing or following embodiments, the EUV light source apparatus further includes a sensor configured to monitor or detect deposition of metal debris, and the controller is configured to control the second mirror to adjust the reflection of the excitation laser based on a monitoring result of the sensor. In one or more of the foregoing or following embodiments, the sensor is a camera. In one or more of the foregoing or following embodiments, when the sensor detects an excessive debris deposition above a threshold, the controller is configured to control the second mirror to direct the excitation laser reflected by the second mirror to the excessive debris deposition. In one or more of the foregoing or following embodiments, the controller is configured to control the first mirror to adjust the reflection of the excitation laser. In one or more of the foregoing or following embodiments, the controller configured to control the second mirror to locally heat inside the EUV light source apparatus. In one or more of the foregoing or following embodiments, the controller configured to control the second mirror to locally heat inside the EUV light source apparatus when the metal droplet generator is not operating.

According to some embodiments of the present disclosure, in a method of operating an EUV light source apparatus, an excitation laser emitted from a laser light source is introduced into the EUV light source, the excitation laser is reflected by one or more mirrors, and inside the EUV light source apparatus is locally heated by the excitation laser reflected by the one or more mirrors. In one or more of the foregoing or following embodiments, the excitation laser is reflected by a first mirror and the excitation laser reflected by the first mirror is reflected by a second mirror. The inside the EUV light source apparatus is locally heated by the excitation laser reflected by the second mirror. In one or more of the foregoing or following embodiments, the excitation laser reflected by the second mirror passes through a zone of excitation of the EUV light source. In one or more of the foregoing or following embodiments, the excitation laser reflected by the second mirror does not pass through a zone of excitation of the EUV light source. In one or more of the foregoing or following embodiments, the interior portion is one of a droplet catcher, a debris collection mechanism or a collector mirror.

According to some embodiments of the present disclosure, in a method of operating an EUV light source apparatus, the EUV light source includes, a metal droplet generator, a collector mirror, an excitation laser inlet port for receiving an excitation laser, a first mirror and a second mirror. The excitation laser is introduced from the inlet port, the excitation laser that passes through a zone of excitation is reflected by the first mirror, and the excitation laser reflected by the first mirror is further reflected by the second mirror. In one or more of the foregoing or following embodiments, the excitation laser reflected by the second mirror is directed to pass through the zone of excitation. In one or more of the foregoing or following embodiments, the excitation laser reflected by the second mirror is directed to hit a metal droplet catcher. In one or more of the foregoing or following embodiments, the first mirror and the second mirror are configured such that the excitation laser reflected by the second mirror hits a metal droplet that is hit by the excitation laser before the excitation laser is reflected by the first mirror. In one or more of the foregoing or following embodiments, the excitation laser reflected by the second mirror is directed not to pass through the zone of excitation. In one or more of the foregoing or following embodiments, the excitation laser reflected by the second mirror is directed to hit a part of a debris collection mechanism. In one or more of the foregoing or following embodiments, the excitation laser reflected by the second mirror is directed to hit the collector mirror.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating an extreme ultra violet (EUV) light source apparatus, the EUV light source comprising, a metal droplet generator, a collector mirror, an excitation laser inlet port for receiving an excitation laser, a first mirror and a second mirror, the method comprising:

introducing the excitation laser from the inlet port;

reflecting the excitation laser that passes through a zone of excitation by the first mirror; and further reflecting the excitation laser reflected by the first mirror by the second mirror.

2. The method of claim 1, comprising directing the excitation laser reflected by the second mirror to pass through the zone of excitation.

3. The method of claim 2, comprising directing the excitation laser reflected by the second mirror to hit a metal droplet catcher.

4. The method of claim 2, comprising configuring the first mirror and the second mirror such that the excitation laser reflected by the second mirror hits a metal droplet that is hit by the excitation laser before the excitation laser is reflected by the first mirror.

5. The method of claim 1, comprising directing the excitation laser reflected by the second mirror not to pass through the zone of excitation.

6. The method of claim 5, comprising directing the excitation laser reflected by the second mirror to hit a part of a debris collection mechanism.

7. The method of claim 5, comprising directing the excitation laser reflected by the second mirror to hit the collector mirror.

8. A method of operating an extreme ultra violet (EUV) light source apparatus, comprising:

introducing an excitation laser emitted from a laser light source into the EUV light source;

reflecting the excitation laser by one or more mirrors inside the EUV light source; and locally heating an interior portion of the EUV light source apparatus by the excitation laser reflected by the one or more mirrors.

9. The method of claim 8, wherein:

the reflecting the excitation laser comprises reflecting the excitation laser by a first mirror and reflecting the excitation laser reflected by the first mirror by a second mirror, and the locally heating an interior portion of the EUV light source apparatus comprises locally heating the interior portion of the EUV light source apparatus by the excitation laser reflected by the second mirror.

10. The method of claim 9, wherein the excitation laser reflected by the second mirror passes through a zone of excitation of the EUV light source.

11. The method of claim 9, wherein the excitation laser reflected by the second mirror does not pass through a zone of excitation of the EUV light source.

12. The method of claim 9, wherein the interior portion is one of a droplet catcher, a debris collection mechanism or a collector mirror.

13. An extreme ultra violet (EUV) light source apparatus, comprising:

a metal droplet generator;

a collector mirror;

an excitation laser inlet port configured to receive an excitation laser;

a first mirror configured to reflect the excitation laser that passes through a zone of excitation;

a second mirror configured to reflect the excitation laser reflected by the first mirror; and a controller configured to control the second mirror to adjust a reflection of the excitation laser.

14. The EUV light source apparatus of claim 13, further comprising a sensor configured to monitor or detect deposition of metal debris, wherein the controller is configured to control the second mirror to adjust the reflection of the excitation laser based on a monitoring result of the sensor.

15. The EUV light source apparatus of claim 13, wherein the sensor is a camera.

16. The EUV light source apparatus of claim 13, wherein when the sensor detects an excessive debris deposition above a threshold, the controller is configured to control the second mirror to direct the excitation laser reflected by the second mirror to the excessive debris deposition.

17. The EUV light source apparatus of claim 13, wherein the controller is configured to control the first mirror to adjust the reflection of the excitation laser.

18. The EUV light source apparatus of claim 13, wherein the controller configured to control the second mirror to locally heat an interior portion of the EUV light source apparatus.

19. The EUV light source apparatus of claim 18, wherein the controller configured to control the second mirror to locally heat an interior portion of the EUV light source apparatus when the metal droplet generator is not operating.

20. The EUV light source apparatus of claim 13, wherein at least one of the first mirror or the second mirror is a flat mirror.

* * * * *